(12) United States Patent
Rodriguez et al.

(10) Patent No.: US 12,405,301 B2
(45) Date of Patent: *Sep. 2, 2025

(54) INTEGRATED CURRENT MONITOR

(71) Applicant: NVIDIA Corporation, Santa Clara, CA (US)

(72) Inventors: Miguel Rodriguez, Santa Clara, CA (US); Suhas Satheesh, Santa Clara, CA (US); Tezaswi Raja, Santa Clara, CA (US); Nishit Harshad Shah, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 256 days.

This patent is subject to a terminal disclaimer.

(21) Appl. No.: 18/303,829

(22) Filed: Apr. 20, 2023

(65) Prior Publication Data
US 2024/0353475 A1    Oct. 24, 2024

(51) Int. Cl.
*G01R 31/28* (2006.01)
*H03K 17/687* (2006.01)

(52) U.S. Cl.
CPC ..... *G01R 31/2839* (2013.01); *G01R 31/2831* (2013.01); *G01R 31/2837* (2013.01); *G01R 31/2851* (2013.01); *H03K 17/6872* (2013.01)

(58) Field of Classification Search
CPC ............ G01R 31/2607; G01R 31/2621; G01R 31/2831; G01R 31/2837; G01R 31/2839; G01R 31/2851; G01R 31/318511; G01R 31/318513

See application file for complete search history.

(56) References Cited

U.S. PATENT DOCUMENTS

| | | | |
|---|---|---|---|
| 5,481,228 A * | 1/1996 | Badyal | H03K 3/0315 331/116 R |
| 6,943,571 B2 | 9/2005 | Worledge | |
| 8,120,356 B2 | 2/2012 | Agarwal et al. | |
| 10,698,020 B2 | 6/2020 | Weimer | |
| 12,158,501 B2 | 12/2024 | Kim et al. | |
| 2009/0138834 A1* | 5/2009 | Boerstler | G01R 31/31727 716/136 |
| 2014/0118021 A1* | 5/2014 | Ponnuvel | H01L 22/14 324/762.03 |
| 2014/0358478 A1* | 12/2014 | Yu | H01L 22/20 702/181 |
| 2015/0212149 A1* | 7/2015 | Smith | G01R 31/2851 324/762.01 |
| 2024/0133952 A1* | 4/2024 | Kerber | H03K 19/018521 |
| 2024/0353475 A1 | 10/2024 | Rodriguez et al. | |

* cited by examiner

*Primary Examiner* — Steven L Yeninas

(57) ABSTRACT

Circuitry and a method of determining electrical characteristics of material local to a specific area of a semiconductor wafer. In one embodiment, the method includes sinking or sourcing current through a selected on of a plurality of devices under test (DUTs) on the semiconductor wafer, converting the current sourcing or sinking into a voltage, comparing the converted voltage against a linear voltage ramp, generating an output clock based on the comparison, and measuring a duty cycle of the output clock. In one embodiment, the duty cycle of the output clock is dependent on the current sinking or sourcing through the selected at least one of the plurality of DUTs on the wafer and electrical characteristics of material local to the specific area of the wafer where the selected one of the plurality of DUTs is located are determined based on the duty cycle of the output clock.

23 Claims, 10 Drawing Sheets

US 12,405,301 B2

INTEGRATED CURRENT MONITOR

TECHNICAL FIELD

This application is directed, in general, to the design and manufacturing of integrated circuits (ICs) on a semiconductor wafer ("wafer") and, more specifically, to determining and using electrical characteristics of the wafer for improving the design and manufacture of the ICs.

BACKGROUND

Accurate knowledge of integrated circuit (IC) or chip characteristics is fundamental to correctly designing ICs and fundamental to predicting performance of those ICs. Typically, semiconductor wafer providers, e.g., wafer foundries, provide a very limited amount of characterization information on a per wafer basis, usually for a small number of sites sparsely distributed on the wafer. One reason for this limitation is that the test structures can be large and take up area that the foundry cannot thus utilize for active dies. This limited wafer characterization data inhibits an ability to correctly predict performance of ICs built on the wafer so that structures and circuits of the ICs function as expected. With decreasing feature sizes of semiconductor technologies and resulting devices, e.g., ICs, correctly designing ICs and predicting their performance is of increasing importance. Thus, e.g., accurate performance models for ICs are more critical than ever.

SUMMARY OF THE DISCLOSURE

In one aspect, an integrated common current monitor (ICCM) for use with a semiconductor wafer is disclosed. In one embodiment, the ICCM comprises DUT selection circuitry and duty cycle measurement circuitry. In one embodiment, the DUT selection circuitry selects at least one of a plurality of DUTs. In one embodiment, the duty cycle measurement circuitry determines electrical characteristics of material local to a specific area of the semiconductor wafer wherein the ICCM is located based on a current throughput of the selected at least one of the plurality of DUTs.

In another aspect, a method of determining electrical characteristics of material local to a specific area of a semiconductor wafer is disclosed. In one embodiment, the method includes sinking or sourcing current through a selected one of a plurality of devices under test (DUTs) on the semiconductor wafer, converting the current sourcing or sinking through the selected at least one of the plurality of DUTs into a voltage, comparing the converted voltage against a linear voltage ramp, generating an output clock based on the comparison, and measuring a duty cycle of the output clock. In one embodiment, the duty cycle of the output clock is dependent on the amount of current sinking or sourcing through the selected at least one of the plurality of DUTs on the semiconductor wafer and electrical characteristics of material local to the specific area of the semiconductor wafer where the selected one of the plurality of DUTs is located are determined based on the duty cycle of the output clock.

In another aspect, an integrated circuit (IC) is disclosed. In one embodiment, the IC comprises at least one processing subsystem, and at least one integrated common current monitor (ICCM) located within the at least one processing subsystem. In one embodiment, the ICCM is configured to determine a duty cycle of a clock signal that corresponds to a current flowing through a selected at least one of the plurality of DUTs, and the current flowing through the selected at least one of the plurality of DUTs represents electrical characteristics of material local to an area of a semiconductor wafer specific to a location of the where the ICCM is located.

In another aspect, a computing system for simulating an integrated circuit (IC) is disclosed. In one embodiment, the computing system comprises an interface for receiving electrical characteristics from at least one integrated common current monitor (ICCM) located on the IC and one or more processors to perform operations. In one embodiment, the operations include generating a model of the IC using the electrical characteristics where the electrical characteristics are determined from a duty cycle measured by the at least one ICCM located on the IC.

In another aspect, a library of circuit designs is disclosed. In one embodiment, the library of circuit designs includes a circuit design for a circuit design for an integrated common current monitor (ICCM). In one embodiment, the ICCM includes DUT selection circuitry to select at least one of a plurality of DUTs and duty cycle measurement circuitry. In one embodiment, the duty cycle measurement circuitry determines electrical characteristics of material local to a specific area of the semiconductor wafer where the ICCM is located based on a current throughput of the selected at least one of the plurality of DUTs (IDUT).

BRIEF DESCRIPTION OF THE DRAWINGS

Reference is now made to the following descriptions taken in conjunction with the accompanying drawings, in which.

DETAILED DESCRIPTION

Figure 1:
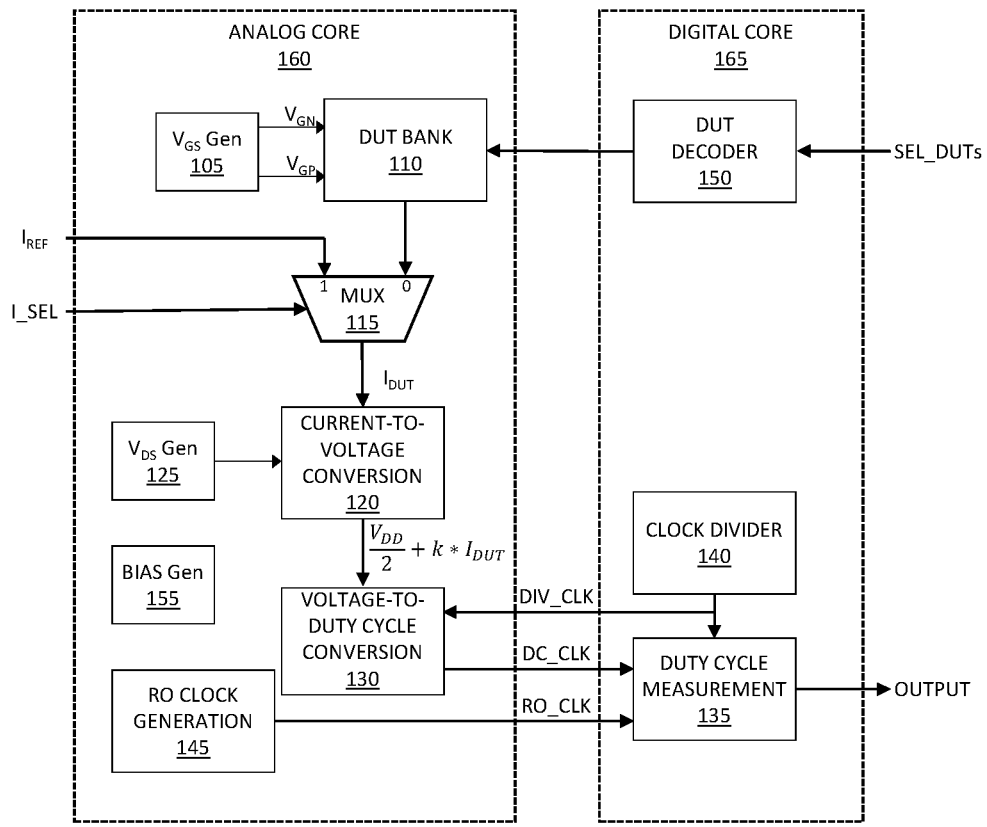
FIG. 1 illustrates a block diagram of an example of an integrated common current monitor (ICCM) in which at least a portion of the circuitry and methods disclosed herein can be implemented.

As noted above, it is desirable for designers of ICs to have access to more extensive wafer electrical characterization information not normally provided by wafer foundries. More extensive wafer electrical characterization information can enable the IC designers to improve the design of ICs by, e.g., improved predictability of performance of those designs, typically through more accurate models of the ICs that have been improved based on the more extensive wafer characterization information. Circuit simulation programs are commonly used by IC designers to predict performance of different circuits in the IC. An example of a circuit simulation program is the Simulation Program with Integrated Circuit Emphasis, or SPICE, developed by at the Electronics Research Laboratory of the University of California, Berkeley.

IC designers usually rely on simulation models, such as SPICE models, provided by the wafer provider, e.g., wafer foundry, which are tuned based on real silicon data. However, as noted above, this data typically is limited to a few locations per wafer. Having access to more extensive wafer electrical characterization information provides the ability to measure circuit characteristics with good spatial resolution within each IC or chip. Having this ability enables improved SPICE to silicon correlation, helps provide chip-to-chip and intra-chip variation, and provides data that can help product binning and debugging.

To obtain an estimate of wafer electrical characterization information, a determination of clock frequencies of ring oscillators (RO) of different lengths deployed on the wafer are conventionally used. The ring oscillator frequency is a function of a current semiconductor process, supply voltage, IR drop in a power supply grid, and capacitance between different RO stages. Unfortunately, the RO frequency does not necessarily correlate well with characterization information provided by the wafer foundry described above.

This disclosure provides circuitry and a method to generate more extensive device electrical characterization information for IC designers to enable them to predict performance of the IC more accurately, thereby enabling design of ICs with significantly improved performance characteristics, i.e., speed and power. The disclosed circuitry and method provides this more extensive device electrical characterization information across a much greater area of the wafer than information typically provided by the wafer foundry. Further, the disclosed circuitry and method accurately estimates a drive strength of individual circuits, such as MOSFET transistors, independent of supply voltage, IR drops, or other circuit parameters. Moreover, the disclosed circuitry and method provide more flexibility to measure individual circuits with, e.g., differing voltage thresholds, channel lengths, etc. and provide indications of local variations of electrical characteristics across the wafer. With this information, process variations in different parts of a same IC and across different ICs on the same wafer can be compared. The disclosed circuitry and method have a huge implication on the ability to correctly model parameters of the IC, e.g., speed and power, which in turn vastly improves the ability to predict the performance of an IC design.

Another distinct advantage provided by the disclosed circuitry and method is that the area of silicon on the wafer required to generate this more extensive wafer electrical characterization information is extremely small in relation to the area of silicon required for the complete IC itself. This yields an area and, by extension, cost efficient solution with significantly improved capability over conventional wafer characterization solutions provided by the wafer foundry.

The disclosed circuitry and method provide an integrated common current monitor (ICCM) that is deployed at least in one instance within the design for an IC where the ICCM provides electrical performance characteristics specific to a location of a semiconductor wafer with much greater granularity as measurements from the ICCM are specific to a location on the wafer where the disclosed ICCM is placed. In many cases, multiple disclosed ICCMs are deployed in the IC design allowing the ability to measure the more extensive electrical wafer characterization information at more than one location within the IC. This deployment of at least one disclosed ICCM in a single IC allows for a much more accurate understanding of localized semiconductor wafer electrical performance than that provided by conventional wafer characterization information from the wafer foundry as discussed above. With a more accurate understanding of localized electrical performance of the semiconductor wafer, more accurate models, e.g., SPICE models, may be constructed yielding increased capabilities to correctly predict performance of the IC in the facing of ever-increasing speed and power performance afforded by advance process technologies. Moreover, given the small size of the ICCM, the area penalty to implement multiple ICCMs is negligible.

The disclosed ICCM(s) measure current throughput of at least one of a plurality of devices under test (DUTs), included therein. The current throughput, which includes sourcing and/or sinking capabilities, referred to herein as $I_{DUT}$, correlates to electrical characteristics at a specific location on the IC (and on the semiconductor wafer), thereby providing more extensive wafer characterization information noted above. Typically, the devices in the DUTs are MOSFET transistors of varying types, voltage thresholds, channel lengths, modes, and other parameters. The DUT MOSFET transistors include, e.g., PMOS type devices and NMOS type devices. The DUT MOSFET transistors can be enhancement mode or depletion mode devices. The DUT MOSFET transistors can have, e.g., low voltage thresholds (e.g., LVT transistors) or ultra-low voltage thresholds (e.g., ULVT transistors). Typically, the DUTs employed will contain MOSFET transistors with like types (e.g., PMOS or NMOS devices), like voltage thresholds (e.g., LVT or ULVT thresholds), like modes (e.g., enhancement mode or depletion mode), and like channel lengths that sink or source current. However, the DUTs employed can include a combination of any of these structures. Furthermore, in some embodiments, the devices of the DUTs can be circuits other than MOSFET transistors whose current throughput is measured to determine the more extensive electrical wafer characterization specific to a location on the IC (and semiconductor wafer). Examples of these circuits other than MOSFET transistors include electromigration monitors, static random-access memories (SRAMs), power delivery circuits, etc.

DUTs are selected based on specific wafer electrical parameters that are desired to be determined at specific locations on the IC (and semiconductor wafer) and, eventually, modeled. Typically, the IC designer selects at least one of the plurality of DUTs included in the ICCM. In one embodiment, multiple of banks of DUTs in the ICCM are available to the IC designer. For example, two banks of 64 different DUTs may reside in a library of DUTs of the ICCM that the IC designer can select from.

The disclosed ICCM is small in area, relative to the balance of the IC design. For example, the area of the complete IC taken up by the ICCM(s) is within a range of about 1000-3000 $\mu m^2$. Further, the disclosed ICCM will detect, e.g., either proportional current measurements or absolute current measurements (if a reference current is known). When the DUTs include MOSFET transistors, current measurements can be made, e.g., with a fixed gate drive voltage ($V_{GS}$) at a desired drain-source voltage ($V_{DS}$). These gate drive and drain-source voltages are configurable and set before measurement of current through the MOSFET DUTs is initiated. The ICCM can provide, e.g., high current measurement accuracy with errors <5% and can be used, e.g., with differing $V_{GS}$ and $V_{DS}$ voltages. Typically, the ICCM is able to measure current within different ranges up to, e.g., several hundreds of μAs and the ICCM can be easily scaled to larger currents if desired.

The disclosed ICCM can accomplish the proportional current measurement using a ratiometric measurement of, e.g., different MOSFET transistor currents detected in the different DUTs that are employed in embodiments where MOSFET transistors are used as the DUTs. Here, typically, drive strengths of NMOS to PMOS transistors in the DUTs of a same type are compared to provide the proportional current measurement, indicative of a skewed threshold of an inverter. Further, drive strengths of different voltage threshold MOSFET transistors (e.g., LVT, ULVT, etc.) can be compared to determine the localized electrical performance of the IC.

The disclosed ICCM is able to measure any current throughput while regulating its terminal voltage in a simple and accurate manner. The current throughput of the selected DUT(s) in the disclosed ICCM produces, e.g., a fixed frequency clock whose duty cycle is linearly dependent on the current being measured with a high level of correlation between the current throughput of the selected DUT and the duty cycle of the fixed frequency clock.

Initially the current throughput of the DUT in the disclosed ICCM is converted into a voltage, typically using, e.g., an operational amplifier in a unity feedback configuration and a programmable resistor. The operational amplifier sources (for NMOS DUTs) or sinks (for PMOS DUTs) the DUT current, e.g., $I_{DUT}$, while regulating the drain-to-source voltage of the DUT to a desired (configurable) value in embodiments where the DUT is a MOSFET transistor. A voltage across the resistor is then converted into a ground-reference voltage that is centered around, e.g., one half of the supply voltage using a conventional instrumentation amplifier structure with two operational amplifiers.

The resulting voltage is then compared against a linear voltage ramp, and a flip-flop is used to generate a final output clock. The voltage ramp can be created with a high impedance current source and a linear capacitor.

The duty cycle of the resulting clock is then measured using a locally generated uncorrelated fast clock and a system of counters. As noted, the disclosed ICCM can measure DUT current ratios or, if a known reference current is provided, the disclosed ICCM can measure absolute DUT currents.

Prior known solutions use a self-clocked system that generates a clock whose frequency is proportional to the current to be measured. In the prior known solutions, the DUT currents are switched into different parts of the IC being designed at a fairly high speed (proportional to the DUT current), and several capacitors are switched in and out of different nodes of the IC being designed. This can cause a number of non-idealities that impact the accuracy and linearity of the current measurement in the DUT. For example, results can strongly depend on op-amp gain-bandwidth product, switch charge injection effects, etc.

The disclosed circuitry and method can be implemented with limited or even no switching around the DUTs and the current-to-voltage conversion. For example, the disclosed circuitry and method can be implemented using only a few elements that actually switch (e.g., the above-mentioned flip-flop and comparator). But even these elements can switch at a fixed, fairly low frequency (e.g., in the low MHz range). Overall, this makes the localized electrical performance characteristics determined by the disclosed ICCM more accurate and reliable.

Furthermore, a library of circuit designs can include a design for the ICCM where the ICCM can, in one embodiment, include DUT selection circuitry and duty cycle management circuitry. In one embodiment, the DUT selection circuitry selects at least one of a plurality of DUTs. In one embodiment the duty cycle measurement circuitry determines electrical characteristics of material local to a specific area of the semiconductor wafer where the ICCM is located based on a current throughput of the selected at least one of the plurality of DUTs ($I_{DUT}$).

Referring to the drawings, specifically FIG. 1, a block diagram of an embodiment of an ICCM 100 is shown. At least one instance of the ICCM 100 can be placed within an IC that is manufactured on a semiconductor wafer. In embodiments where DUTs of ICCM 100 are MOSFET transistors, ICCM 100 includes Vas generation circuitry 105 and $V_{DS}$ generation circuitry 125. In most embodiments, ICCM 100 includes a bank of DUTs 110, multiplexer circuitry (MUX) 115, current-to-voltage conversion circuitry 120, voltage-to-duty cycle conversion circuitry 130, and duty cycle measurement circuitry 135. As detailed below, $V_{GS}$ generation circuitry 105 generates gate voltages for MOSFET transistor embodiments of selected DUTs of DUT bank 110, e.g., a gate voltage for NMOS transistors (e.g., $V_{GN}$) and/or a gate voltage for PMOS transistors (e.g., $V_{GP}$) for MOSFET transistor embodiments of selected DUTs of DUT bank 110. $V_{DS}$ generation circuitry 125 configures drain-to-source voltages for MOSFET transistor embodiments of selected DUTs of DUT bank 110. DUT bank 110 includes a plurality of DUTs that are selected, e.g., NMOS transistors (used, e.g., as current sinks) and/or PMOS transistors (used, e.g., as current sources) in MOSFET transistor embodiments of the DUTs. A signal external to ICCM 100, e.g., SEL_DUTs is input to DUT decoder 150, the output of which is input to DUT bank 110 to select at least one of the DUTs in DUT bank 110. MUX 115 allows either a known reference current supplied externally to ICCM 100, e.g., IREF (used, e.g., to calibrate ICCM 100), or a current throughput, e.g., $I_{DUT}$, of the selected DUTs of DUT bank 110 to be supplied to current-to-voltage conversion circuitry 120 where the current throughput of the selected DUTs, e.g., $I_{DUT}$, is converted to a corresponding voltage (noted as $$\text{``} \frac{V_{DD}}{2} + k * I_{DUT} \text{''}$$

in FIG. 1 as detailed further below). The corresponding voltage converted from the $I_{DUT}$ from selected DUTs by current-to-voltage conversion circuitry 120 is fed to voltage-to-duty cycle conversion circuitry 130 where a duty cycle of a clock signal input to current-to-duty cycle conversion circuitry, e.g., DIV_CLK, is adjusted based on the corresponding voltage fed to voltage-to-duty cycle conversion circuitry 130 to produce a resulting clock signal, e.g., DC_CLK. The duty cycle of the resulting clock, e.g., DC_CLK, is then measured in duty cycle measurement circuitry 135 using a locally generated uncorrelated fast clock, e.g., RO_CLK, generated by ring oscillator (RO)

clock generation circuitry 145. Duty cycle measurement circuitry 135 can include additional logic circuitry, such as illustrated in duty cycle measurement circuitry 620 if FIG. 6, to determine the duty cycle of the resulting clock. The duty cycle of the resulting clock highly correlates to the current throughput of the selected DUTs, e.g., $I_{DUT}$. And the current throughput directly correlates to electrical characteristics of material local to an area of an IC specific to a location on a semiconductor wafer at which the IC is manufactured. The electrical characteristics of the semiconductor wafer local to the area on the IC specific to the ICCM is determined by the duty cycle of the resulting clock (which correlates to the current passed through the ICCM, e.g., $I_{DUT}$) is then used to categorize or "bin out" dies on the wafer and to generate a model of the IC, e.g., a SPICE model, at that specific location on the semiconductor wafer based on the duty cycle of the resulting clock as measured by duty cycle measurement circuitry 135 for future designs using the same wafer technology.

The disclosed circuitry are either in an analog core or domain (referred to herein as an analog core 160) of the ICCM 100 or a digital core or domain (referred to herein as a digital core 165) of the ICCM 100. For example, $V_{GS}$ generation circuitry 105, DUT bank 110, MUX 115, current-to-voltage conversion circuitry 120, $V_{DS}$ generation circuitry 125, voltage-to-duty cycle conversion circuitry 130, and RO clock generation circuitry 145 are in the analog core 160 of ICCM 100. Analog core 160 also includes bias generation circuitry 155 which will be described below. Digital core 165 includes duty cycle measurement circuitry 135 as well as DUT decoder circuitry 150 and clock divider (CLK DIV) circuitry 140, which also will be described below.

Figure 2:
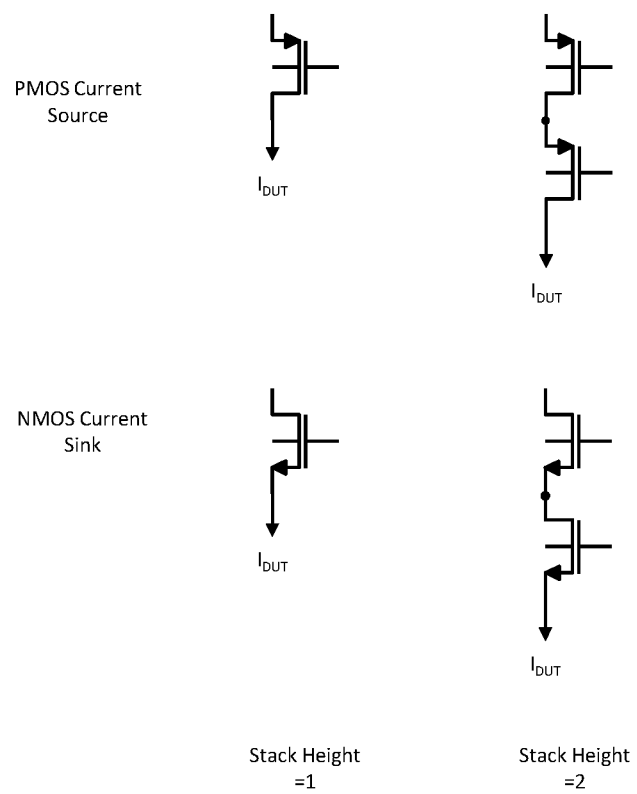
FIG. 2 illustrates a circuit diagram of a subset of the DUTs that can be used with the example of the ICCM.

FIG. 2 illustrates a circuit diagram of a subset of the DUTs 200 that can be included in DUT bank 110 of FIG. 1 for MOSFET transistor embodiments of the DUTs. As disclosed above, an IC designer selects one or more DUTs based on specific wafer electrical parameters that are desired to be determined at a specific location on an IC (and at its corresponding location on a semiconductor wafer) and, eventually, modeled for the specific location of the IC. For example, the IC designer causes a signal, e.g., SEL_DUTs to be input to a DUT decoder, e.g., DUT decoder 150 of ICCM 100 as depicted in FIG. 1 and described above. The DUT decoder, e.g., DUT decoder 150 of FIG. 1, uses the SEL_DUTs signal to generate a signal to DUT bank 110 which is used to select which DUTs of DUT bank 110 are to be used. The DUT can be a single MOSFET transistor or a group of MOSFET transistors. As depicted in FIG. 2, the DUT can be a PMOS transistor with a stack height of one or two. Of course, the stack height can be greater than two if necessary. The PMOS transistor or transistor stack DUT, referred to herein as a PMOS transistor device DUT, will provide a current source, i.e., $I_{DUT}$, to be measured by the other above-disclosed circuitry of the ICCM in which the PMOS transistor device DUT resides. The amount of current sourced by the PMOS transistor device DUT correlates directly to specific wafer electrical parameters for the specific location on the IC of the ICCM and its corresponding PMOS transistor device DUT which, in turn, is used in a circuit model, i.e., a SPICE model.

Alternately, as depicted in FIG. 2, the DUT can be an NMOS with transistor with a stack height of one or two. Again, the stack height can be greater than two if necessary. The NMOS transistor or transistor stack DUT, referred to herein as an NMOS transistor device DUT, will provide a current sink, i.e., $I_{DUT}$ to be measured by the other above-disclosed circuitry of the ICCM in which the NMOS transistor device DUT resides. As with the PMOS transistor device DUT, the amount of current sinked by the NMOS transistor device DUT is measured by the other above-disclosed circuitry of the ICCM in which the NMOS transistor device DUT resides. The amount of current sinked by the NMOS transistor device DUT correlates directly to specific wafer electrical parameters for the specific location on the IC of the ICCM and its corresponding NMOS transistor device DUT which, in turn, is used in a circuit model, i.e., a SPICE model.

Additionally, the DUTs 200 as depicted in FIG. 2 can have, e.g., differing voltage thresholds, channel lengths, modes, etc. For example, the IC designer can not only select PMOS current sources or NMOS current sinks with differing stack heights, but the IC designer can select PMOS or NMOS transistors device DUTs with, e.g., low voltage thresholds (e.g., LVT transistors) or ultra-low voltage thresholds (e.g., ULVT transistors). Further, the IC designer can select depletion mode or enhancement mode PMOS or NMOS transistor device DUTs. While the DUTs selected by the IC designer will typically contain MOSFET transistors with like types (e.g., PMOS or NMOS devices), like voltage thresholds (e.g., LVT or ULVT thresholds), like modes (e.g., enhancement mode or depletion mode), and like channel lengths that sink or source current for MOSFET transistor device DUTs, the DUTs employed can include a combination of any of these structures. This gives the IC designer greater flexibility to measure many, many different specific wafer electrical characteristics for a specific location of the IC by selecting DUTs of differing types (PMOS or NMOS), voltage thresholds (e.g., LVT or ULVT), modes (depletion or enhancement), and channel lengths, e.g., yielding significantly greater modeling capabilities. In one embodiment, multiple of banks of DUTs are available to the IC designer in DUT bank 110. For example, the IC designer may select at least one DUT from two banks of 64 different MOSFET transistor device DUTs which may reside in DUT bank 110 of the ICCM.

The disclosed ICCM can, as disclosed above, accomplish proportional current measurement using a ratiometric measurement of different MOSFET transistor currents, e.g., different $I_{DUT}$s $I_{DUT1}$ and $I_{DUT2}$, in the different DUTs that are employed. Here, typically, drive strengths of NMOS to PMOS transistors device DUTs of a same type are compared to provide the proportional current measurement, indicative of a skewed threshold of an inverter. Further, drive strengths of different voltage threshold MOSFET transistors (e.g., LVT, ULVT, etc.) can be compared to determine the localized electrical performance of the IC.

As noted above, the area required to implement an ICCM is relatively small compared to the area of the IC being designed. As such, multiple disclosed ICCMs can be deployed in the IC design allowing the ability to measure the more extensive electrical wafer characterization information at more than one specific location in the IC. This deployment of at least one disclosed ICCM in a single IC allows for a much more accurate understanding of localized semiconductor wafer electrical performance than that provided by the conventional wafer characterization information provided by the wafer foundry discussed above.

As depicted in FIG. 2, for MOSFET transistor embodiments of the DUTs each of the MOSFET transistors in the various DUTs 200 shown include a gate. A voltage must be applied to the gate for the DUT to source or sink current, e.g., $I_{DUT}$. As disclosed above, the transistors in the DUTs depicted in FIG. 2 can have differing thresholds (e.g., LVT or ULVT). As such, the voltage applied to the gate of the various DUTs, e.g., $V_{GP}$ for PMOS transistors in the DUT of FIG. 2 or $V_{GN}$ for NMOS transistors in the DUT of FIG. 2 must correspond to the transistors in the respective selected DUT(s) of FIG. 2. Vgs generation circuitry 105 if FIG. 1, e.g., provides the appropriate gate voltages for the selected DUTs of FIG. 2. In order to measure the current throughput of the ICCM predictably, the gate voltage of the DUT is regulated by, e.g., $V_{GS}$ generation circuitry 105. Further, a drain-source voltage can be configured for the selected DUTs of FIG. 2. $V_{DS}$ circuitry 125 of FIG. 1, e.g., generates the drain-source voltage (e.g., $V_{DS}$) for the selected DUTs of FIG. 2.

Figure 3:
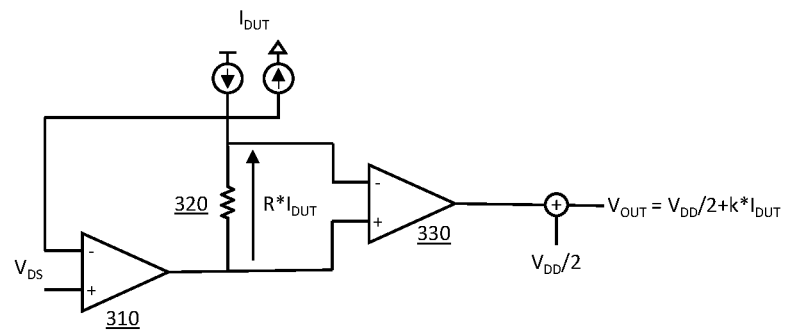
FIG. 3 illustrates a circuit diagram of an example of an embodiment of current-to-voltage conversion circuitry in the example of the ICCM.

FIG. 3 illustrates a circuit diagram of an embodiment of current-to-voltage conversion circuitry 300 constructed according to principles of the disclosure. Current-to-voltage conversion circuitry 300 provides and an example of current-to-voltage circuitry 120 of FIG. 1. Of course, other conventional current-to-voltage sources could be used. As disclosed above, the current, e.g., $I_{DUT}$ from the selected DUT(s) is fed to current-to voltage conversion circuitry 120. In one embodiment, the current from the selected DUT(s) is converted into voltage using an operational amplifier 310 in a unity feedback configuration and a programmable resistor 320 as depicted in FIG. 3. Operational amplifier 310 sources (NMOS) or sinks (PMOS) the DUT current, e.g., $I_{DUT}$, while the drain-to-source voltage (e.g., $V_{DS}$) of the DUT(s) is regulated to a desired (configurable) value, e.g., by $V_{DS}$ generation circuitry 125 of FIG. 1. The voltage across programmable resistor 320, e.g., $R*I_{DUT}$, is then converted into a ground-reference voltage centered around one half of a supply voltage (e.g., $V_{DD}$) using an amplifier, such as conventional instrumentation amplifier structure 330. The output of the conventional instrumentation amplifier 330 is $$V_{OUT} = \frac{V_{DD}}{2} + k*I_{DUT}.$$

The output can be provided to voltage-to-duty conversion circuitry, such as voltage-to-duty cycle conversion circuitry 140 of FIG. 1.

This approach is very linear. The $V_{DS}$ voltage is now fixed to $$\frac{V_{DD}}{2},$$

however, a simple digital-to-analog converter (DAC) could be used to provide different $V_{DS}$ options given that the operational amplifier, e.g., op amp 310, is designed to operate with a wide input/output range. Bias circuitry, e.g., bias generation circuitry 160 of FIG. 1, can generate necessary bias signals, such as all necessary bias signals, for the operational amplifiers of the current-to-voltage conversion circuitry, e.g., op amp 310 and op amps of conventional instrumentation amplifier structure 330 of FIG. 3. (The bias circuitry, e.g., bias generation circuitry 160 of FIG. 1 can similarly provide necessary bias signals for other analog circuitry, e.g., a ramp generator described below.) This bias circuitry, e.g., bias generation circuitry 160 of FIG. 1, can also provide three control bits (e.g., BIASCTRL[2:0] bits) which are used to modify a size of an NFET that creates a source bias voltage for other circuits, with the aim of keeping the bias current constant at different voltages. This bias current is roughly $$I_{bias} \approx \frac{V_{DD} - V_{th}}{R} * M,$$

where M is a size ratio that can be controlled with the control bits, e.g., BIASCTRL[2:0].

The operational amplifiers, as represented by op amp 310, are optimized so that they are stable over a wide range of operating conditions and corners at $V_{DD}$=0.7V. At higher voltages, the increase of the bias current increases a gain of the operational amplifiers and can make the operational amplifiers unstable. The BIASCTRL bits allow for the current to be kept roughly constant for different $V_{DD}$ voltages and thus helps ensure stability.

Figure 4:
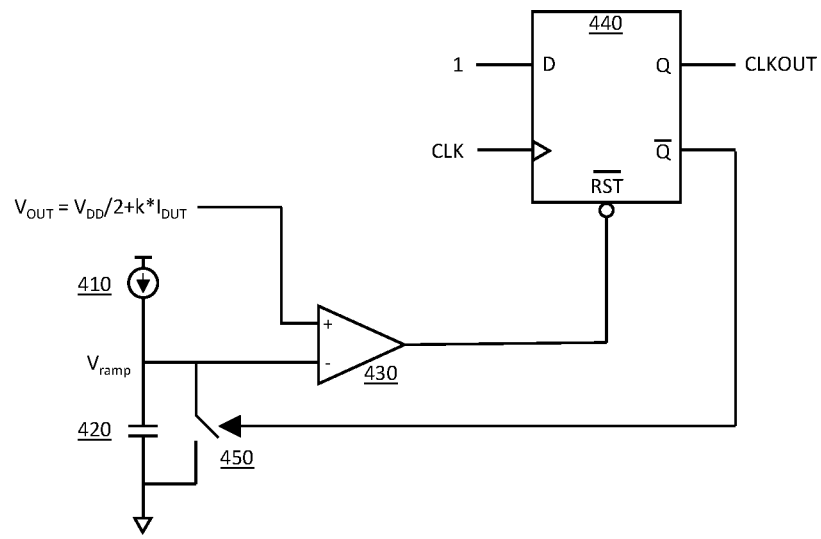
FIG. 4 illustrates a circuit diagram of an example of an embodiment of voltage-to-duty cycle conversion circuitry in the example of the ICCM.

FIG. 4 illustrates a circuit diagram of an embodiment of voltage-to-duty cycle conversion circuitry 400 which can be implemented by voltage-to-duty cycle conversion circuitry 130 of FIG. 1. As disclosed above, the corresponding voltage output from current-to-voltage conversion circuitry 120 of FIG. 1 is input to voltage-to-duty cycle conversion circuitry 130 of FIG. 1. Similarly, the corresponding voltage output from the current-to-voltage conversion circuitry 300 of FIG. 3, e.g., $$V_{OUT}\left(=\frac{V_{DD}}{2} + k*I_{DUT}\right)$$

can be input to voltage-to-duty cycle conversion circuitry 400 of FIG. 4. Current source 410 is used to charge linear capacitor 420. When a voltage across linear capacitor 420 reaches $V_{OUT}$ from current-to-voltage conversion circuitry $$\left(\frac{V_{DD}}{2} + k*I_{DUT}\right),$$

e.g., current-to-voltage conversion circuitry 300 of FIG. 3, comparator 430 resets an output of D flip-flop 440 which is read as the output clock CLKOUT. An input clock rising edge to D flip-flop 440 (divided appropriately) sets the output of D flip-flop 440 back to a high state (or "1"). And the inverse output of D flip-flop 440, e.g., Q, is fed back to switch 450 which resets the charging of capacitor 420. The output clock CLKOUT can be provided to duty cycle measurement circuitry, such as duty cycle measurement circuitry 620 of FIG. 6, to determine localized electrical performance characteristics by the disclosed ICCM.

Figure 5:
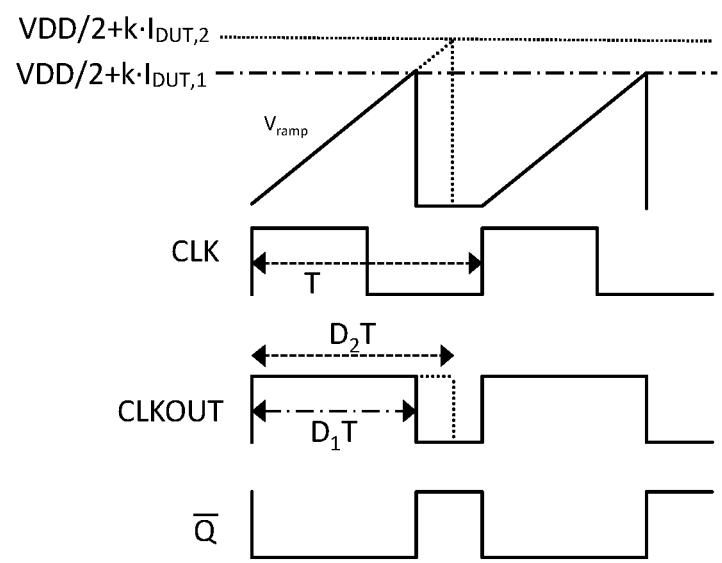
FIG. 5 illustrates an embodiment of a timing diagram of the voltage-to-duty cycle conversion circuitry in the example of the ICCM.

FIG. 5 illustrates an embodiment of a timing diagram 500 of the voltage-to-duty cycle conversion circuitry 400 of FIG. 4. If the slope of the voltage ramp, e.g., $V_{ramp}$ of FIG. 4, is constant, the duty cycle of CLKOUT is proportional to the input voltage and, therefore, to the current in the selected DUT, e.g., $I_{DUT}$. The slope of the voltage ramp, e.g., $V_{ramp}$, can be made to be very constant by using a linear capacitor, e.g., linear capacitor 420 of FIG. 4, and a cascode-type current source with high impedance, e.g., current source 410 of FIG. 4. In this embodiment, when the voltage ramp, e.g., $V_{ramp}$, increased from $$\frac{V_{DD}}{2} + k*I_{DUT,1} \text{ to } \frac{V_{DD}}{2} + k*I_{DUT,2}$$

the duty cycle of the CLKOUT signal, e.g., from D flip-flop 440 of FIG. 4, increases from $D_1T$ to $D_2T$, where T is the period of the CLK signal, e.g., into D flip-flop 440 of FIG. 4. Thus, the duty cycle of the CLKOUT signal from, e.g., D flip-flop 440 of FIG. 4, is proportional to the voltage signal input into, e.g., comparator 430 of voltage-to-duty cycle conversion circuitry 400 of FIG. 4.

In one embodiment, a 10 MHz clock is desired to cover a whole duty cycle range. For example, an input JTAG clock of 40 MHz could be used and divided by four to generate the 10 MHz clock. In an embodiment, two bits can be used to help control the voltage ramp, e.g., $V_{ramp}$. These bits can be converted into a 3b thermometer code signal and used to control the current source, e.g., current source 410 of FIG. 4. This enables a wider tuning range with a goal of having roughly 50% duty cycle at ~0 current for maximum dynamic range.

Figure 6:
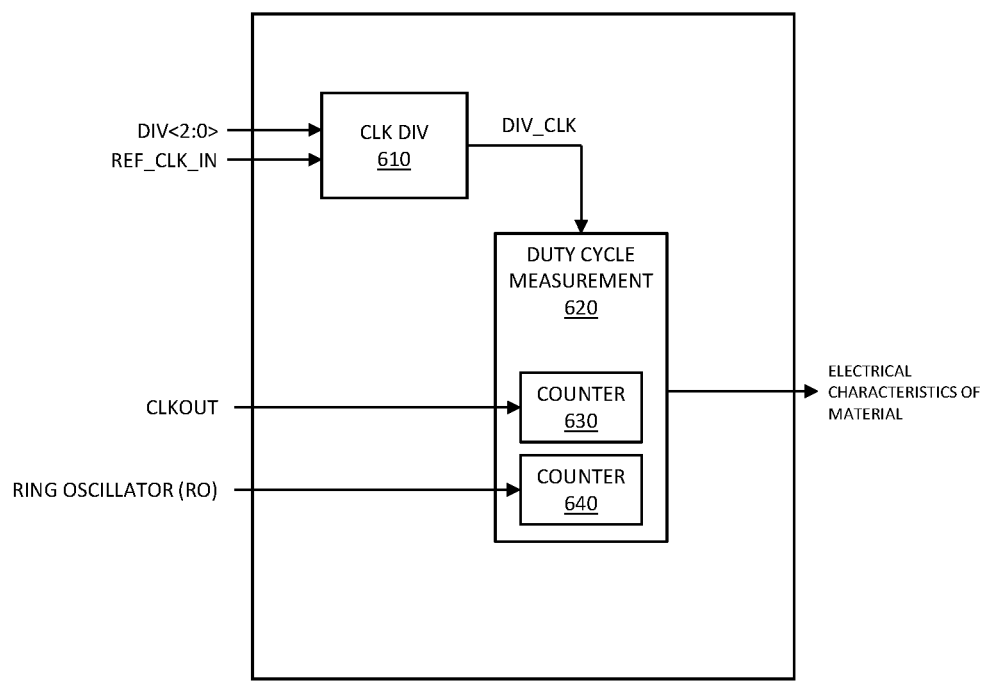
FIG. 6 illustrates a block diagram of an example of an embodiment of a digital logic circuitry in the example of the ICCM.

FIG. 6 illustrates an embodiment of digital logic 600 that can be used to measure the duty cycle of the output clock, e.g., the CLKOUT signal of voltage-to-duty cycle conversion circuitry 400 of FIG. 4. Digital logic 600 is mainly designed to perform duty cycle measurements of the output clock, e.g., CLKOUT signal of voltage-to-duty cycle conversion circuitry 400 of FIG. 4, using an uncorrelated ring oscillator (RO) clock, e.g., RO 170 in the analog core of the block diagram of the embodiment of ICCM 100 of FIG. 1. A reference clock, e.g., REF_CLK_IN of FIG. 6, is input into a clock divider, e.g., CLK DIV 610 of FIG. 6 and is divided by another input into the clock divider, e.g., DIV<2: 0> signal of FIG. 6 input into CLK DIV 610. This reference clock is designed to be ~3 GHz @ 0.7V (default operating voltage) and a divided output, e.g., divided by 2, of the reference clock (to help get a 50% duty cycle) is used as a nominal clock, e.g., the DIV_CLK signal of FIG. 6, for duty cycle measurement circuitry 620 of the digital logic 600 of FIG. 6. Two counters, e.g., counter 630 and counter 640 of the digital logic 600 of FIG. 6, are used for duty cycle measurement, e.g., duty measurement circuitry 620 of the digital logic 600 of FIG. 6. One counter, e.g., counter 640, runs directly on a RO clock signal generated by the RO, e.g., RO 170 in the analog core of the block diagram of the embodiment of ICCM 100 of FIG. 1. Counter 640 counts, e.g., $2^{16}-1$ cycles once measurement starts. Counter 630 runs on the same RO clock signal but is enabled by a synchronized version of the output clock signal, e.g., CLKOUT signal from D flip-flop 440 of the voltage-to-duty cycle conversion circuitry 400 of FIG. 4. Digital logic 600 also includes synchronizers (not shown) for all of the input signals to the digital logic, including those that come from a JTAG domain and the synchronizers perform CDC on the RO clock signal.

Therefore, counter 630 only counts when the output clock signal, e.g., CLKOUT, is high. After the $2^{16}-1$ RO clock cycles measured by counter 640, the duty cycle of the output clock signal from the voltage-to-duty conversion circuitry 400 of FIG. 4, i.e., the CLKOUT signal can be calculated as a ratio between the counters. This ratio corresponds to the current through the DUT, e.g., $I_{DUT}$, as disclosed above and, therefore, corresponds to a current flowing through the DUT as measured by the ICCM, e.g., ICCM 100 of FIG. 1. And this current directly correlates to the electrical characteristics of the semiconductor wafer local to the ICCM.

Figure 7:
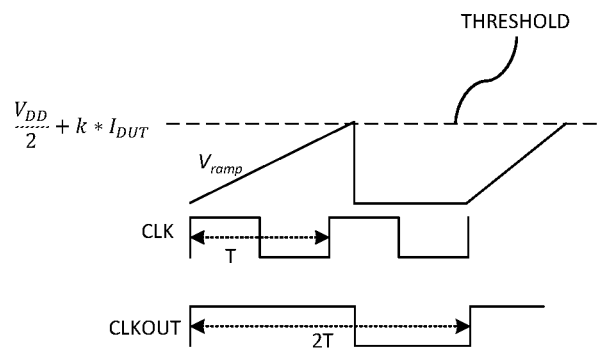
FIG. 7 illustrates an embodiment of a timing diagram of an example of an overflow scenario possible in the example of the ICCM.

One issue of this disclosed ICCM occurs when the ramp of the output voltage of the current-to-voltage conversion circuitry does not reach the threshold, e.g., $$\frac{V_{DD}}{2} + k * I_{DUT}$$

output voltage signal of current-to-voltage conversion circuitry 300 of FIG. 3, before a new clock pulse arrives, known as an overflow scenario. FIG. 7 illustrates an embodiment of a timing diagram 700 of this overflow scenario. As depicted in FIG. 7, when the voltage does not reach the threshold (indicated as "THRESHOLD" in FIG. 7), e.g., $$\frac{V_{DD}}{2} + k * I_{DUT}$$

before the rising edge of a second clock signal, e.g., after period T of the CLK signal into to D flip-flop 440 of voltage-to-duty cycle conversion circuitry 400 of FIG. 4, the output clock signal, e.g., the CLKOUT signal from D flip-flop 440 of voltage-to-duty cycle conversion circuitry 400 of FIG. 4, will have an unintended period of, e.g., 2T. Digital logic 600 of FIG. 6 further includes logic to detect this overflow scenario (not shown in FIG. 6). Digital logic 600 can then, e.g., provide an alert and allow prevention of the overflow scenario using conventional logic as understood by one of ordinary skill in the art.

Figure 8:
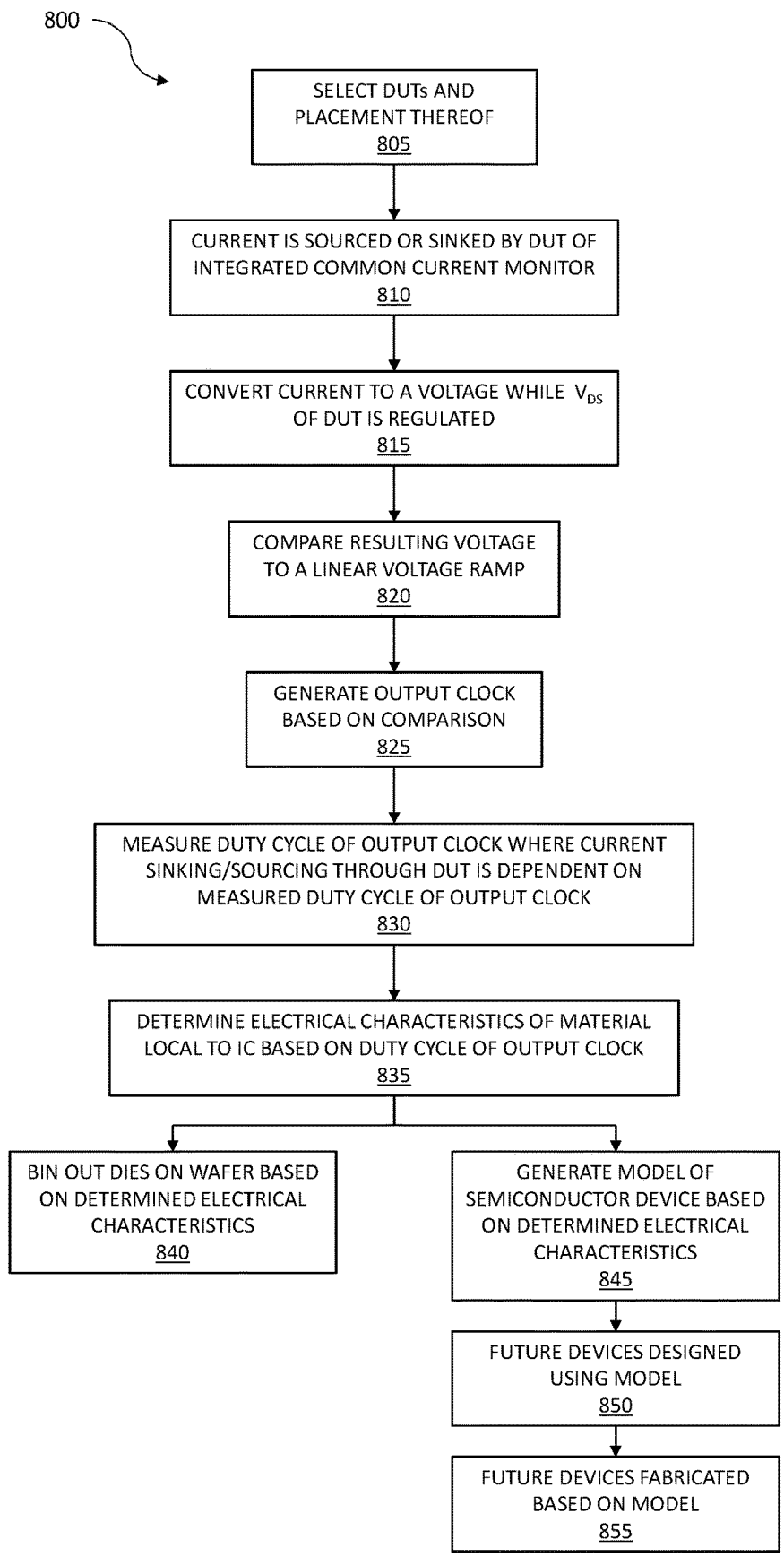
FIG. 8 illustrates a flow diagram of an example method for determining electrical characteristics specific to a location of a semiconductor wafer.

FIG. 8 illustrates a flow diagram 800 of an example method for characterizing local electrical characteristics of silicon carried out according to principles of the disclosure. Method 800 can use the ICCM as disclosed herein. Method 800 starts at step 805 where typically, e.g., an IC designer, will select locations on an IC under design for placement of device(s) under test, e.g., DUT(s) 200 of FIG. 2 of, e.g., ICCM 100 of FIG. 1.

At step 810 of method 800, current is sourced or sinked, e.g., $I_{DUT}$ of FIGS. 1-2, by the selected DUT(s), e.g., DUT(s) 200 of FIG. 2 of a corresponding ICCM, e.g., ICCM 100 of FIG. 1. At step 815, the current from the DUT(s), e.g., $I_{DUT}$, is converted to a voltage with, e.g., current-to-voltage conversion circuitry 130 of FIG. 1 or current-to-voltage conversion circuitry 300 of FIG. 3. As disclosed above, a voltage across the DUT(s), e.g., $V_{DS}$ of DUT(s) 200 of FIG. 2, is regulated while the conversion of the current to a voltage is performed.

At step 820, the converted voltage, e.g., $$\frac{V_{DD}}{2} + k * I_{DUT},$$

is compared to a linear voltage ramp, e.g., $V_{ramp}$ of FIGS. 4-5 with, e.g., voltage-to-duty cycle conversion circuitry 140 of FIG. 1 or voltage-to-duty cycle conversion circuitry 400 of FIG. 4. At step 825 an output clock is generated based on the comparison, e.g., output clock signal CLKOUT from D flip-flop 440 of voltage-to-duty cycle conversion circuitry 400 of FIG. 4 and as depicted in the embodiment of a timing diagram 500 of FIG. 5 for voltage-to-duty cycle conversion circuitry 400 of FIG. 4.

At step 830 a duty cycle of an output clock, e.g., output clock signal CLKOUT from D flip-flop 440 of voltage-to-duty cycle conversion circuitry 400 of FIG. 4, is measured, e.g., with duty cycle measurement circuitry 135 of FIG. 1 or duty cycle measurement circuitry 620 of digital logic circuitry 600 of FIG. 6. Current sinking or sourcing through, e.g., DUT(s) 200 of FIG. 2 is dependent on the measured duty cycle of the output clock, e.g., output clock signal CLKOUT from D flip-flop 440 of voltage-to-duty cycle conversion circuitry 400 of FIG. 4 as measured, e.g., by duty cycle measurement circuitry 620 of digital logic circuitry 600 of FIG. 6. As disclosed above, the measurement of the duty cycle of the output clock can be determined from a ratio of counts in counters, e.g., counters 630 and 640 in digital logic circuitry 600 of FIG. 6.

At step 835, electrical characteristics of material of a semiconductor wafer local to an IC (and its specific location of DUT(s) and corresponding integrated current monitors) are determined based on the measured duty cycle of the output clock, e.g., output clock signal CLKOUT from D flip-flop 440 of voltage-to-duty cycle conversion circuitry 400 of FIG. 4. As disclosed above, the determined electrical characteristics of material of the semiconductor wafer local to the IC is used to "bin out" dies on the wafer and generate a model of the IC, e.g., a SPICE model, for further designs using the same wafer technology. At step 840, dies of the wafer are "binned out" based on the determined electrical characteristics of material of the semiconductor wafer local to the IC. At step 845 a model, e.g., a SPICE model, of circuitry of the ICCMs is generated based on the determined electrical characteristics of the material of the semiconductor wafer local to the specific location of the IC that includes the ICCMs and corresponding DUTs. At step 850, future devices are designed using the model, e.g., the SPICE model and at step 855, devices are fabricated based on the design using the model, e.g., the SPICE model.

As disclosed above, since this SPICE model is based on a specific location on the semiconductor wafer where the ICCMs and corresponding DUTs are located, this SPICE model is much more accurate that a SPICE model based on electrical characteristics of the semiconductor wafer provided by the wafer foundry since the electrical characteristics of the semiconductor wafer provide by the wafer foundry are for locations not specific to the location of the ICCMs and their corresponding DUTs.

Figure 9:
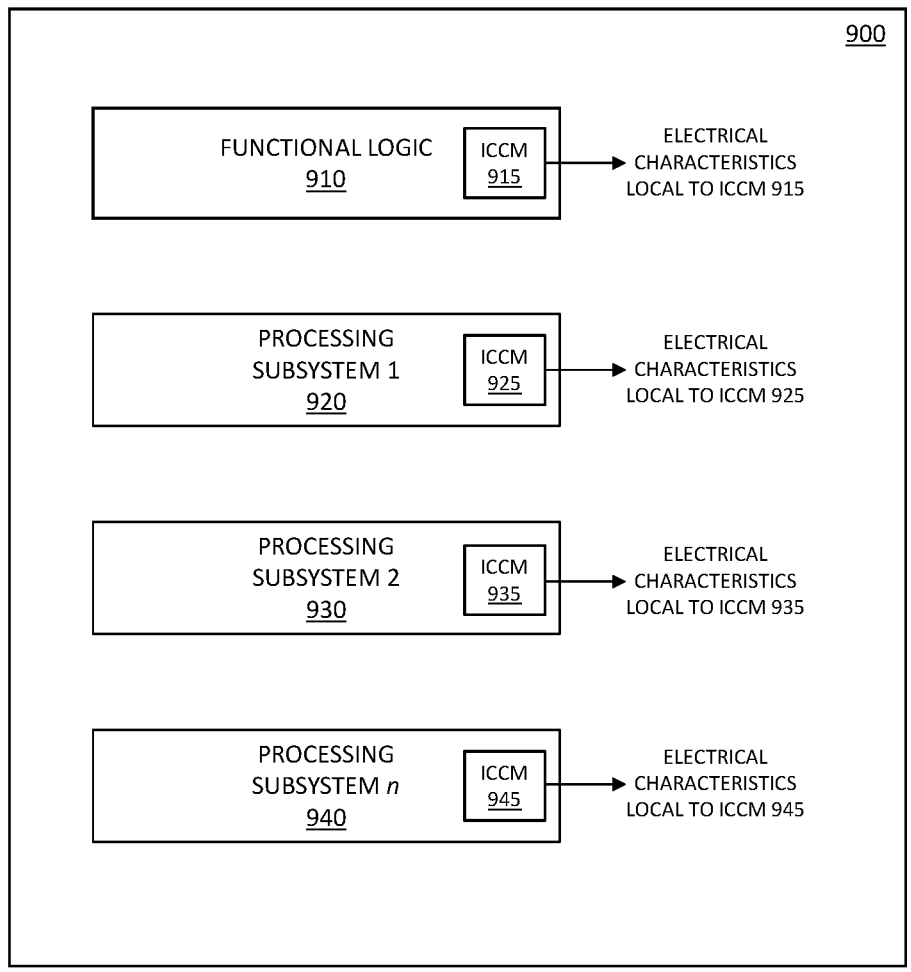
FIG. 9 illustrates an example of an integrated circuit (IC) in which at least a portion of the circuitry and methods disclosed herein can be implemented.

FIG. 9 illustrates a block diagram of an example of IC 900 constructed according to principles of the disclosure. IC 900 includes functional logic block 910 and processing subsystem 1 920, processing subsystem 2 930, through processing subsystem n 940. The processing subsystems can be, e.g., central processing units (CPUs), graphics processing units (GPUs), memory controllers, etc. Each of the functional logic and processing subsystems includes an ICCM, e.g., ICCM 915, ICCM 925, ICCM 935, and ICM 945, respectively, each ICCM as disclosed above. ICCM 915, e.g., provides electrical characteristics of a semiconductor wafer on which IC 900 is manufactured that are specific to the location of ICCM 915. ICCM 925, e.g., provides electrical characteristics of the semiconductor wafer local to ICCM 925. ICCM 935, e.g., provides electrical characteristics of the semiconductor wafer local to ICCM 935. And ICCM 945, e.g., provides electrical characteristics of the semiconductor wafer local to ICCM 945. Models, e.g., SPICE models, can be generated from each different local electrical characteristics of the semiconductor wafer, providing much more accurate modeling of the semiconductor wafer than that modeling provided from electrical characteristics of the semiconductor wafer provided by the foundry.

Figure 10:
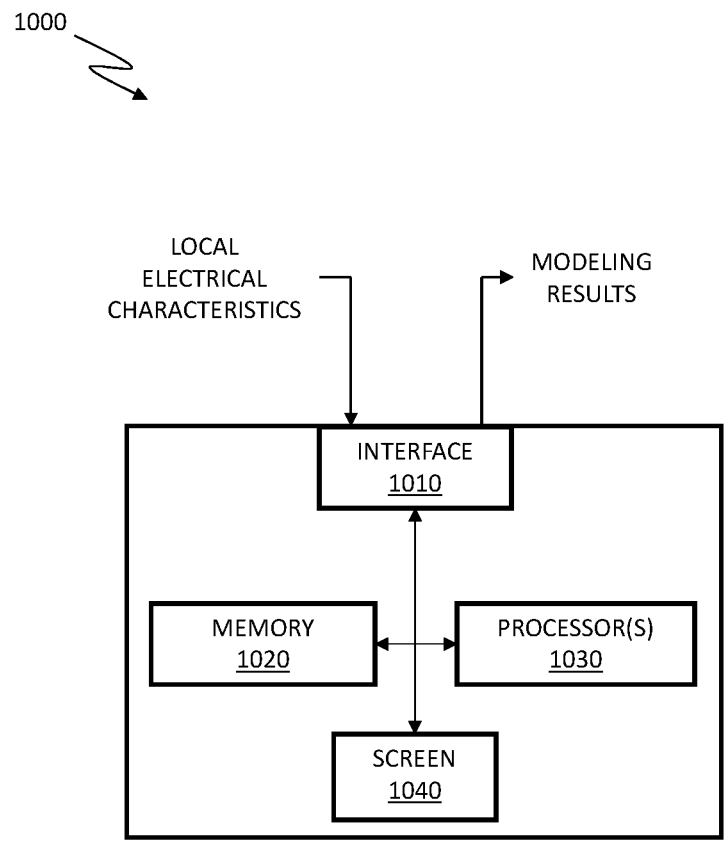
FIG. 10 illustrates block diagram of a computing system for simulating an IC according in which methods disclosed herein can be implemented.

FIG. 10 illustrates a block diagram of a computing system 1000 for simulating an IC according to principles of the disclosure. Computing system 1000 includes interface 1010, memory 1020, one or more processors represented by processor 1030, and screen 1040 that are communicatively coupled to one another using, e.g., conventional means. It is understood that the number of processors and the configuration that can be used for computing system 1000 is not limited as illustrated. For example, computing system 1000 may not include screen 1040.

Interface 1010 is configured to communicate, i.e., transmit and receive data. As such, interface 1010 includes the necessary logic and circuitry to communicate data. Interface 1010 can be a conventional interface. Interface 1010 receives electrical characteristics for a specific location of a semiconductor wafer, e.g., from ICCMs 915, 925, 935, and/or 945 of FIG. 9.

Memory 1020 can be a non-transitory memory that stores data, e.g., the electrical characteristics, which is used for modeling the semiconductor wafer at the specific location from which the electrical characteristics were determined according to the principles of the disclosure. The memory 1020 also store a series of operating instructions corresponding to one or more algorithms that when executed, cause the processor 1030 to model the semiconductor wafer based on the electrical characteristics. The operating instruction can correspond to one or more steps of method 800. Memory 1020 may be a conventional memory device such as flash memory, ROM, PROM, EPROM, EEPROM, DRAM, SRAM, etc.

Processor 1030 can be a data processing unit, such as a central processing unit (CPU) or a graphics processing unit (GPU), which can operate according to the operating instructions stored on the memory 1020. As noted above, the computing system 1000 can include more than one processor and the processors can be of different types.

Screen 1040 provides a visual interface for users and can display results of the modeling. For example, computing system 1000 can be a desktop computer or be a cloud-based device and interface 1010 can communicate via a cloud-based network environment. Accordingly, the electrical characteristics can be received via the network, processing can be performed by a cloud-based server, and the modeling results can be sent via the network to the user.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein. The data storage media can be part of or associated with the digital data processors or computers.

The digital data processors or computers can be comprised of one or more GPUs, one or more CPUs, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip. Configured means, for example, designed, constructed, or programmed, with the necessary logic and/or features for performing a task or tasks.

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing system(s) 1000 of FIG. 10—e.g., each device may include similar components, features, and/or functionality of the computing system(s) 1000.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

A network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

Those skilled in the art to which this application relates will appreciate that other and further additions, deletions, substitutions and modifications may be made to the described embodiments.

Various aspects of the disclosure can be claimed including those noted in the summary. Each of the aspects noted in the summary may have one or more of the elements of the dependent claims presented below in combination.

What is claimed is:

1. An integrated common current monitor (ICCM) for use with a semiconductor wafer, comprising:
   DUT selection circuitry to select at least one of a plurality of DUTs; and
   duty cycle measurement circuitry to determine electrical characteristics of the semiconductor wafer where the ICCM is located based on a current throughput of the selected at least one of the plurality of DUTs (IDUT).

2. The ICCM as recited in claim 1, wherein:
   the ICCM further comprises gate-source voltage ($V_{GS}$) generation circuitry programmable to provide gate-source voltage to the selected at least one of the plurality of DUTs; and
   current-to-voltage conversion circuitry that converts IDUT current to a corresponding voltage using a regulated drain-to-source voltage ($V_{DS}$) of the selected at least one of the plurality of DUTs.

3. The ICCM as recited in claim 2, wherein the current-to-voltage conversion circuitry includes an operational amplifier in a unity feedback configuration and a programmable resistor and a voltage across the programmable resistor is converted to a ground-reference voltage centered around one half of a supply voltage to an IC that includes the ICCM.

4. The ICCM as recited in claim 3, wherein the voltage across the programmable resistor is converted using an instrumentation amplifier structure with at least two additional operational amplifiers.

5. The ICCM as recited in claim 2, wherein the regulated $V_{DS}$ value is regulated using a value that is configurable.

6. The ICCM as recited in claim 2, further comprising voltage-to-duty cycle conversion circuitry operable to generate a duty cycle based on an uncorrelated clock signal and the corresponding voltage, wherein the voltage-to duty cycle conversion circuitry further comprises a high impedance current source and a linear capacitor to generate a voltage ramp to compare to the corresponding voltage.

7. The ICCM as recited in claim 6, wherein the duty cycle measurement circuitry further determines the electrical characteristics based on the duty cycle and the uncorrelated clock signal.

8. The ICCM as recited in claim 1, wherein an absolute current throughput of the selected at least one of the plurality of DUTs is determined using a known current.

9. The ICCM as recited in claim 1, wherein IDUT is determined from a ratio of duty cycles of output clocks measured by the duty cycle measurement circuitry for selected first and second ones of the plurality of DUTs.

10. The ICCM as recited in claim 1, wherein the plurality of DUTs include DUTs with MOSFET transistors of different types, MOSFET transistors of different modes, MOSFET transistors having different voltage thresholds, and MOSFET transistors having different channel lengths wherein:
- the different types of MOSFET transistors are PMOS and NMOS;
- the different modes of MOSFET transistors are enhancement and depletion modes; and
- the MOSFET transistors having different voltage thresholds are low voltage threshold (LVT) transistors and ultra-low voltage threshold (ULVT) transistors.

11. A method of determining electrical characteristics of a specific area of a semiconductor wafer, comprising:
- sinking or sourcing current through a selected at least one of a plurality of devices under test (DUTs) on the semiconductor wafer;
- converting the current sourcing or sinking through the selected at least one of the plurality of DUTs into a voltage;
- comparing the converted voltage against a linear voltage ramp;
- generating an output clock based on the comparison;
- measuring a duty cycle of the output clock; wherein:
  - the duty cycle of the output clock is dependent on the current sinking or sourcing through the selected at least one of the plurality of DUTs on the semiconductor wafer; and
  - the electrical characteristics of the semiconductor wafer where the selected one of the plurality of DUTs is located are determined based on the duty cycle of the output clock.

12. The method as recited in claim 11, wherein the measuring of the duty cycle of the output clock uses a locally generated uncorrelated fast clock and a plurality of counters.

13. The method as recited in claim 11, further comprising:
- providing a gate-source voltage to the selected at least one of the plurality of DUTs;
- regulating a drain-to-source voltage ($V_{DS}$) of the selected at least one of the plurality of DUTs to a value; and
- generating a model of an integrated circuit (IC) that includes the plurality of DUTs using the electrical characteristics of the material local to the area on the wafer on which the IC is manufactured.

14. The method as recited in claim 13, wherein the value regulated $V_{DS}$ value is configurable.

15. The method as recited in claim 11, wherein the converting the current sourcing or sinking through selected at least one of the plurality of DUTs comprises converting a voltage across a programmable resistor in a unity feedback configuration of an operational amplifier to a ground-reference voltage centered around one half of a supply voltage to the IC.

16. The method as recited in claim 15, wherein the voltage across the programmable resistor is converted using an instrumentation amplifier structure with at least two additional operational amplifiers.

17. The method as recited in claim 11, wherein the generation of the output clock uses a flip-flop.

18. The method as recited in claim 11, wherein the linear voltage ramp is generated with a high impedance current source and a linear capacitor.

19. The method as recited in claim 11, wherein an absolute current sinking or sourcing through the selected at least one of the plurality of DUTs can be determined if a known current is provided.

20. The method as recited in claim 11, wherein the current sinking or sourcing through the selected at least one of the plurality of DUTs can be determined by comparing counts in the plurality of counters.

21. An integrated circuit (IC), comprising:
- at least one processing subsystem; and
- at least one integrated common current monitor (ICCM) located within the at least one processing subsystem, wherein the at least one ICCM comprises:
  - DUT selection circuitry to select at least one of a plurality of DUTs; and
  - duty cycle management circuitry to determine electrical characteristics of a semiconductor wafer where the at least one ICCM is located based on a current throughput of the selected at least one of the plurality of DUTs ($I_{DUT}$).

22. The IC as recited in claim 21, wherein the electrical characteristics are used to generate a model of the IC.

23. A computing system for simulating an integrated circuit (IC) comprising:
- an interface for receiving electrical characteristics from at least one integrated common current monitor (ICCM) located on the IC, wherein the at least one ICCM comprises:
  - DUT selection circuitry to select at least one of a plurality of DUTs; and
  - duty cycle management circuitry to determine electrical characteristics of a semiconductor wafer where the at least one ICCM is located based on a current throughput of the selected at least one of the plurality of DUTs ($I_{DUT}$); and
- one or more processors to perform operations, the operations including generating a model for the IC using the electrical characteristics.

* * * * *